(12) United States Patent
Feuerbaum et al.

(10) Patent No.: US 12,046,540 B2
(45) Date of Patent: Jul. 23, 2024

(54) LEADFRAME PACKAGE WITH ADJUSTABLE CLIP

(71) Applicant: Infineon Technologies AG, Neubiberg (DE)

(72) Inventors: Christian Feuerbaum, Munich (DE); Thomas Stoek, Buxtehude (DE)

(73) Assignee: Infineon Technologies AG, Neubiberg (DE)

( * ) Notice: Subject to any disclaimer, the term of this patent is extended or adjusted under 35 U.S.C. 154(b) by 327 days.

(21) Appl. No.: 17/117,283

(22) Filed: Dec. 10, 2020

(65) Prior Publication Data

US 2022/0189855 A1    Jun. 16, 2022

(51) Int. Cl.
*H01L 23/495* (2006.01)
*H01L 23/00* (2006.01)

(52) U.S. Cl.
CPC .. *H01L 23/49524* (2013.01); *H01L 23/49503* (2013.01); *H01L 23/49562* (2013.01); *H01L 23/49579* (2013.01); *H01L 24/37* (2013.01); *H01L 24/40* (2013.01); *H01L 24/84* (2013.01); *H01L 23/49551* (2013.01);
(Continued)

(58) Field of Classification Search
CPC ......... H01L 23/49503; H01L 23/49562; H01L 23/49579; H01L 23/49551; H01L 23/49524; H01L 2224/3701; H01L 2224/73263; H01L 2224/37012; H01L 2224/37013; H01L 2224/40245; H01L 2224/84801; H01L 2224/81; H01L 24/37; H01L 24/40; H01L 24/84; H01L 24/81; H01L 2924/181; H01L 2224/37147; H01L 2224/40499; H01L 2224/84424; H01L 2224/84447; H01L 2224/84455; H01L 2224/8446; H01L 2924/00012; H01L 2924/00014; H01L 2924/01006; H01L 2924/013; H01L 2924/014;
(Continued)

(56) References Cited

U.S. PATENT DOCUMENTS

| 2009/0065910 A1* | 3/2009 | Hamada | H01L 24/84 438/120 |
| 2013/0009295 A1* | 1/2013 | Otremba | H01L 24/83 257/676 |

(Continued)

FOREIGN PATENT DOCUMENTS

WO    WO-2012053131 A1 *    4/2012    ............. H01L 24/37

*Primary Examiner* — Shaun M Campbell
*Assistant Examiner* — Aneta B Cieslewicz
(74) *Attorney, Agent, or Firm* — Dicke, Billig & Czaja, PLLC

(57) ABSTRACT

An integrated circuit package includes a leadframe with a die pad and a lead. A semiconductor die is attached to a top surface of the die pad. A clip has a lead contact area with a surface pattern on a bottom surface of the clip that is proximate to a first end of the clip. A portion of the surface pattern is attached to a top surface of a terminal pad of the lead. The clip includes a die contact area on the bottom surface of the clip that is proximate to a second end of the clip. The die contact area of the clip is attached to a top contact on the semiconductor die. The surface pattern has a length in a longitudinal direction of the clip in a direction parallel with a plane of the bottom surface of the die pad that is greater than a length of the top surface of the terminal pad of the lead.

20 Claims, 8 Drawing Sheets

(52) U.S. Cl.
CPC ........... *H01L 2224/3701* (2013.01); *H01L 2224/37012* (2013.01); *H01L 2224/37013* (2013.01); *H01L 2224/37147* (2013.01); *H01L 2224/40245* (2013.01); *H01L 2224/40499* (2013.01); *H01L 2224/73263* (2013.01); *H01L 2224/84424* (2013.01); *H01L 2224/84447* (2013.01); *H01L 2224/84455* (2013.01); *H01L 2224/8446* (2013.01); *H01L 2224/84801* (2013.01); *H01L 2924/181* (2013.01)

(58) Field of Classification Search
CPC ............ H01L 2224/34–41505; H01L 2224/84–84986; H01L 24/34–41; H01L 23/495–49586
See application file for complete search history.

(56) References Cited

U.S. PATENT DOCUMENTS

| | | | | |
|---|---|---|---|---|
| 2014/0374926 | A1* | 12/2014 | Miyakawa | H01L 24/39 257/786 |
| 2015/0061003 | A1* | 3/2015 | Zundel | H01L 27/088 257/334 |
| 2018/0342438 | A1* | 11/2018 | Chen | H01L 23/49568 |

* cited by examiner

LEADFRAME PACKAGE WITH ADJUSTABLE CLIP

FIELD OF TECHNOLOGY

The present application relates to a leadframe package with a semiconductor die and a clip that electrically connects a top contact of the semiconductor die with a lead of the leadframe. More specifically, the present disclosure relates to a clip which can accommodate semiconductor dies having different sizes.

BACKGROUND

An important objective with the design of power devices for high power and high current applications is minimizing the on-resistance of the power device in order to improve overall power efficiency. The total on-resistance when a power device is conducting current is a sum of the resistance of the semiconductor die mounted within a package and the resistance of the package which electrically connects the semiconductor die to external leads of the package. Conductive clips have been used to replace traditional bond wire connections due to the significant reductions in package resistance that can be achieved when compared to packages that use bond wires. Conventional clips that are designed for leadframe packages have a length that accommodates a connection to a top contact of the semiconductor device which is mounted in the center of the die pad of the leadframe. Smaller die however still have to be mounted in the center of the die pad due to the length of the conventional clip which results in a higher than necessary on-resistance contribution from the package.

For these and other reasons, there is a need for the present invention.

SUMMARY

According to an embodiment of an integrated circuit package, the integrated circuit package includes a leadframe that includes a die pad and a lead. A semiconductor die is attached to a top surface of the die pad. The integrated circuit package includes a clip having a lead contact area with a surface pattern on a bottom surface of the clip that is proximate to a first end of the clip. A portion of the surface pattern is attached to a top surface of a terminal pad of the lead. The clip includes a die contact area on the bottom surface of the clip that is proximate to a second end of the clip. The die contact area of the clip is attached to a top contact on the semiconductor die. The surface pattern has a length in a longitudinal direction of the clip in a direction parallel with a plane of the bottom surface of the die pad that is greater than a length of the top surface of the terminal pad of the lead.

According to an embodiment of an integrated circuit package, the integrated circuit package includes a leadframe that includes a die pad and a lead. A semiconductor die is attached to a top surface of the die pad. The die pad has a right side, a left side and a center equidistant from the right side and the left side in a direction parallel with a plane of the top surface of the die pad. The integrated circuit package includes a clip that includes a surface pattern on a bottom surface of the clip that is proximate to a first end of the clip. A portion of the surface pattern is attached to a top surface of a terminal pad of the lead. The clip includes a die contact area on the bottom surface of the clip that is proximate to a second end of the clip. The die contact area is attached to a top contact on the semiconductor die. The surface pattern includes features that extend downward from the bottom surface of the clip. The surface pattern has a length in a longitudinal direction of the clip in the direction parallel with a plane of the bottom surface of the die pad that is greater than a length of the top surface of the terminal pad of the lead.

According to an embodiment of a method of forming an integrated circuit package, the method includes providing a leadframe that includes a die pad and a lead having a terminal pad, where the die pad has a right side, a left side and a center equidistant from the right side and the left side in a direction parallel with a plane of the top surface of the die pad. The method includes providing a clip that includes a surface pattern on a bottom surface of the clip that is proximate to a first end of the clip. The clip includes a die contact area on the bottom surface of the clip that is proximate to a second end of the clip. The surface pattern includes features that extend downward from the bottom surface of the clip. The surface pattern has a length in a longitudinal direction of the clip in a direction parallel with a plane of the bottom surface of the die pad that is greater than a length of the top surface of the terminal pad of the lead. The method includes attaching a semiconductor die to the top surface of the die pad. The method includes attaching the die contact area of the clip to a top contact on the semiconductor die. The die contact area of the clip is attached to the top contact on the semiconductor die above the top surface of the die pad and between the center and the right side of the top surface of the die pad in a direction perpendicular to a plane of the top surface of the die pad. The method includes attaching a portion of the surface pattern on the bottom surface of the clip to a top surface of the terminal pad of the lead such that other portions of the surface pattern on the bottom surface of the clip that are not attached to the top surface of the terminal pad are on a right side of the top surface of the terminal pad.

According to an embodiment of a method of forming an integrated circuit package, the method includes providing a leadframe that includes a die pad and a lead having a terminal pad. The die pad has a right side, a left side and a center equidistant from the right side and the left side in a direction parallel with a plane of the top surface of the die pad. The method includes providing a clip that includes a surface pattern on a bottom surface of the clip that is proximate to a first end of the clip. The clip includes a die contact area on the bottom surface of the clip that is proximate to a second end of the clip. The surface pattern includes features that extend downward from the bottom surface of the clip. The surface pattern has a length in a longitudinal direction of the clip in a direction parallel with a plane of the bottom surface of the die pad that is greater than a length of the top surface of the terminal pad of the lead. The method includes attaching a semiconductor die to the top surface of the die pad. The method includes attaching the die contact area of the clip to a top contact on the semiconductor die. The die contact area of the clip is attached to the top contact on the semiconductor die above the top surface of the die pad at approximately the center of the top surface of the die pad in a direction perpendicular to a plane of the top surface of the die pad. The method includes attaching a portion of the surface pattern on the bottom surface of the clip to a top surface of the terminal pad of the lead such that other portions of the surface pattern on the bottom surface of the clip that are not attached to the top surface of the terminal pad are on a left side of the top surface of the terminal pad.

According to an embodiment of an apparatus, the apparatus includes a leadframe that includes a die pad and a lead, where the lead has a terminal pad. A clip includes a lead contact area with a surface pattern on a bottom surface of the clip that is proximate to a first end of the clip, where the surface pattern is configured to be attached to a top surface of the terminal pad. The clip includes a die contact area on the bottom surface of the clip that is proximate to a second end of the clip. The surface pattern has a length in a longitudinal direction of the clip in a direction parallel with a plane of the bottom surface of the die pad that is greater than a length of the top surface of the terminal pad so that a die selected from a plurality of dies each having a different size in the longitudinal direction of the clip in the direction parallel with the plane of the bottom surface of the die pad can be attached to the die pad with the die contact area of the clip attached to a top contact on the semiconductor die such that a different portion of the surface pattern of the clip is attached to the top surface of the terminal pad of the lead depending on the size of the selected die.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

Figure 1:
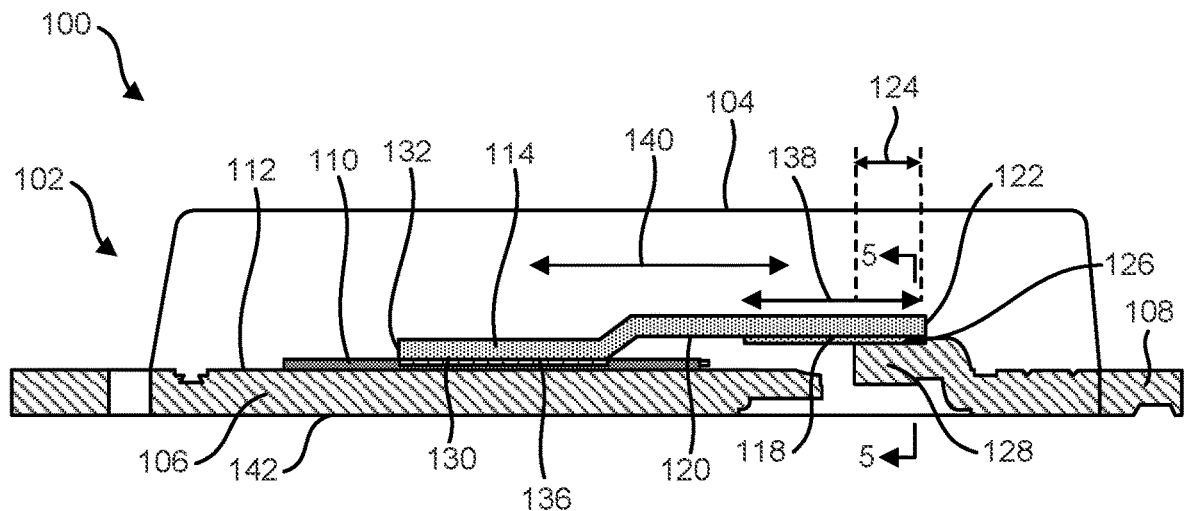
FIG. 1 illustrates an embodiment of a cross-sectional view of an integrated circuit package.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing", "upper," "lower," "right", "left", "vertical," "horizontal" etc., is used with reference to the orientation of the Figure(s) being described. Because components of embodiments can be positioned in a number of different orientations, the directional terminology is used for purposes of illustration and is in no way limiting.

As employed in this specification, the terms "bonded", "attached", "connected", "coupled" and/or "electrically connected/electrically coupled" are not meant to mean that the elements or layers must directly be contacted together; intervening elements or layers may be provided between the "bonded", "attached", "connected", "coupled" and/or "electrically connected/electrically coupled" elements, respectively. However, in accordance with the disclosure, the above-mentioned terms may, optionally, also have the specific meaning that the elements or layers are directly contacted together, i.e. that no intervening elements or layers are provided between the "bonded", "attached", "connected", "coupled" and/or "electrically connected/electrically coupled" elements, respectively.

Furthermore, the word "over" used with regard to a part, element or material layer formed or located "over" a surface may be used herein to mean that the part, element or material layer be located (e.g. placed, formed, deposited, etc.) indirectly on the implied surface with the part, element or material layer or layers being arranged between the implied surface and the part, element or material layer. However, the word "over" used with regard to a part, element or material layer formed or located "over" a surface may optionally also have the specific meaning that the part, element or material layer be located (e.g. placed, formed, deposited, etc.) directly on, e.g. in direct contact with, the implied surface.

The semiconductor die may be of different types, may be manufactured by different technologies and may include, for example, integrated electrical, electro-optical or electro-mechanical circuits and/or passive devices. The semiconductor die may, for example, be logic integrated circuits, analog integrated circuits, mixed signal integrated circuits, power integrated circuits, memory circuits or passive devices. They may include control circuits, microprocessors or microelectromechanical components. The semiconductor die may be power semiconductor die that include, but are not limited to, Metal Oxide Semiconductor Field-effect Transistors (MOSFETs), Insulated Gate Bipolar Transistors (IGBTs), Gallium Nitride (GaN) devices, Silicon Carbide (SiC) devices, Junction Gate Field Effect Transistors (JFETs), as well as power bipolar transistors or power diodes.

The integrated circuit packages, lead frames and leadframe modules described herein include packages such as a Transistor Outline Leadless (TOLL) package, a Quad Flat No Leads Package (QFN) package, a Small Outline (SO) package, a SS08 package, a Small Outline Transistor (SOT) package, a Thin Small Outline Package (TSOP) package, a Dual Small Outline Package (DSO) and a Double Sided Cooling (DSC) package. The leadframe modules can include multiple semiconductor die on a same die pad or on different die pads of the leadframe module.

It is to be understood that the features of the various exemplary embodiments described herein may be combined with each other, unless specifically noted otherwise. It is to be understood that other embodiments may be utilized and structural or logical changes may be made without departing from the scope of the present invention. The following detailed description, therefore, is not to be taken in a limiting sense, and the scope of the present invention is defined by the appended claims.

FIG. 1 illustrates an embodiment of a cross-sectional view of an integrated circuit package at 100. Integrated circuit package 100 can be any suitable type of package that includes, but is not limited to, a TOLL package, a SS08 package, S308 package, a QFN package, an SO package, a SOT package, a TSOP package, a DSO package, a DSC package and a leadframe module. In the illustrated embodiment, a lead frame 102 includes a die pad 106 and a lead 108. A semiconductor die 110 is attached to a top surface 112 of the die pad 106. A clip 114 includes a lead contact area 116 with a surface pattern 118 on a bottom surface 120 of the clip 114 that is proximate to a first end 122 of the clip 114 (See also, FIGS. 2-3B). In the illustrated embodiment, the clip 114 comprises copper (Cu). In the illustrated embodiment, the leadframe 102 comprises copper (Cu). In other embodiments, leadframe 102 can be formed from other suitable materials that include, but are not limited to, aluminum (Al), nickel (Ni), iron (Fe) and steel. In the illustrated embodiment, semiconductor die 110 is a Metal Oxide Semiconductor Field-effect Transistor (MOSFET) and includes a top contact 136 which is a source contact and includes a bottom drain contact which is electrically coupled to the top surface 112 of die pad 106. In other embodiments, semiconductor die 110 can be other suitable types of devices such as an Insulated Gate Bipolar Transistor (IGBT), a Gallium Nitride (GaN) device or a Silicon Carbide (SiC) device.

In the illustrated embodiment, a portion illustrated at 124 of the surface pattern 118 is attached to a top surface 126 of terminal pad 128 of the lead 108. The clip 114 includes a die contact area 130 on the bottom surface 120 of the clip 114 that is proximate to a second end 132 of the clip 114. The die contact area 130 is attached to a top contact 136 on the top side of semiconductor die 110. The surface pattern 118 has a length illustrated at 138 in a longitudinal direction 140 of the clip 114 in a direction parallel with a plane of the bottom surface 142 of the die pad 106 that is greater than a length 124 of the top surface 126 of the terminal pad 128 of the lead 108 (See also, FIG. 2). A mold compound 104 encapsulates the semiconductor die 110, the clip 114 and a portion of the leadframe 102.

Figure 2:
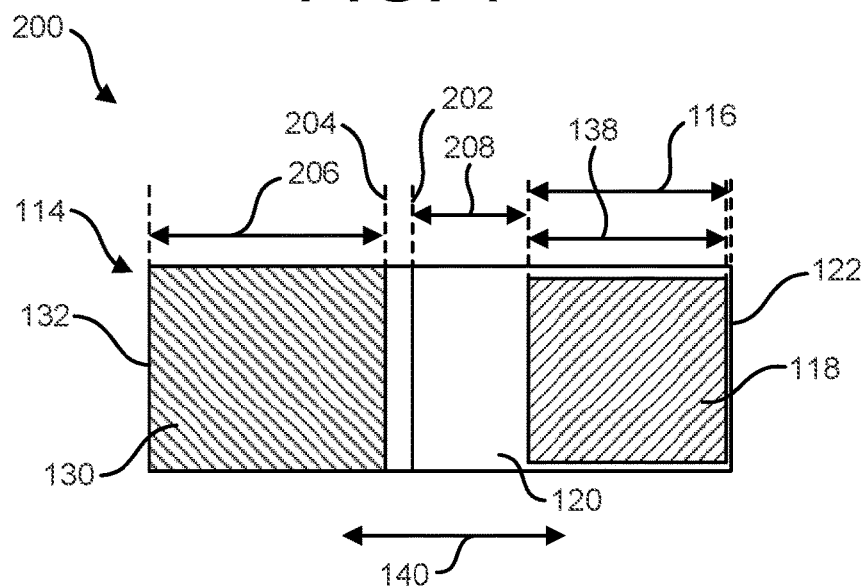
FIG. 2 illustrates an embodiment of a bottom view of the clip illustrated in FIG. 1.

FIG. 2 illustrates an embodiment of a bottom view at 200 of the clip 114 illustrated in FIG. 1. The clip 114 includes a step portion between 202 and 204 between the first end 122 of clip 114 and the second end 132 of clip 114. The surface pattern 118 is between the first end 122 of clip 114 and the step portion edge at 202. The die contact area 130 is between the second end 132 of clip 114 and the step portion edge at 204. The bottom surface 120 of the clip 114 between the step portion 202/204 and the surface pattern 118 is illustrated at 208. The die contact area 130 has a length illustrated at 206 that is between the second end 132 and the step portion edge at 204. The length 138 of the surface pattern 118 is slightly less than the length of the lead contact area illustrated at 116. In other embodiments, the length 138 of the surface pattern 118 is equal to the length illustrated at 116 for the lead contact area 116.

Figure 3A:
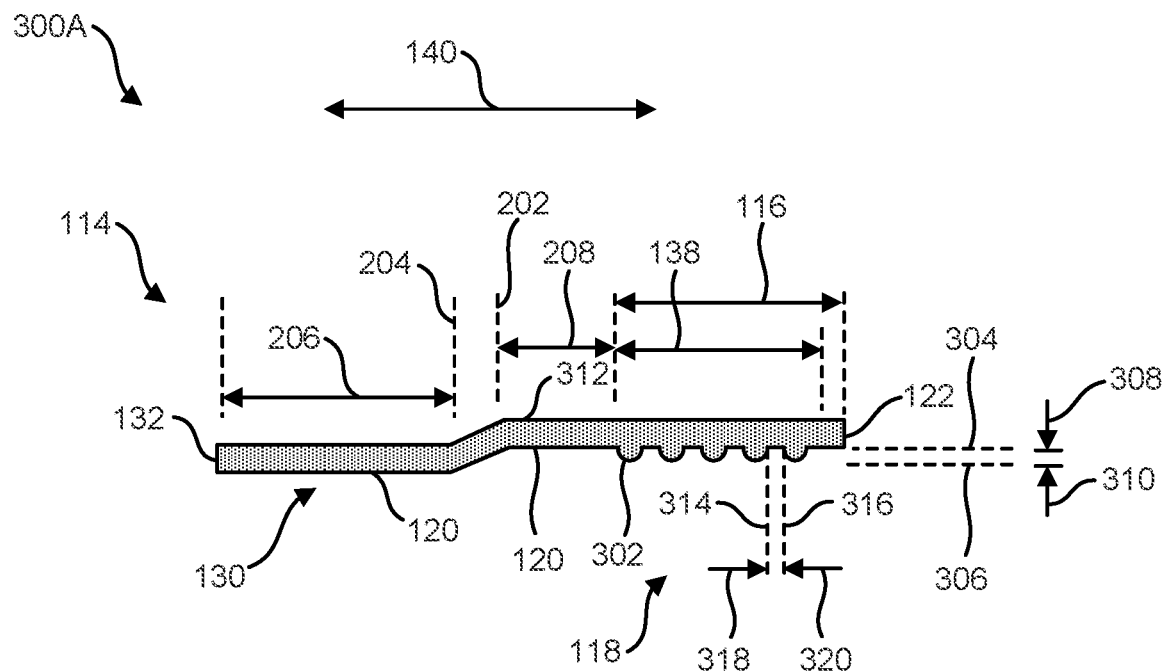
FIGS. 3A and 3B illustrates embodiments of a side view of a clip.
Figure 3B:
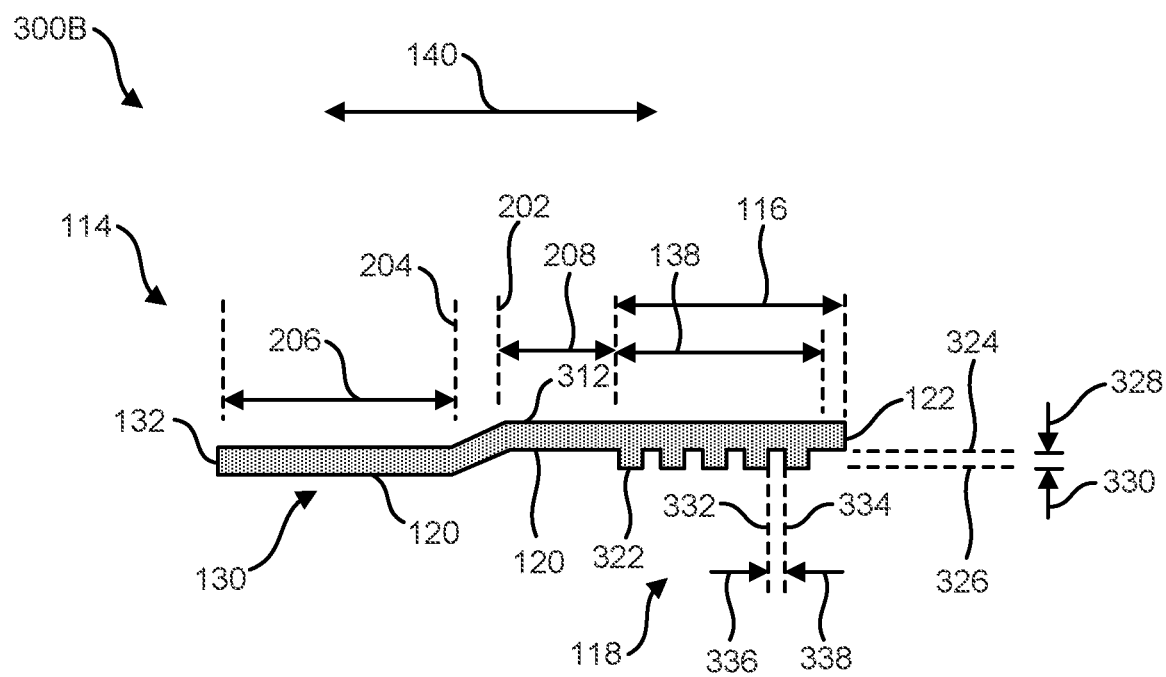

FIGS. 3A and 3B illustrates embodiments of a side view at 300A and 300B of the clip 114 illustrated in FIG. 1 and FIG. 2. Referring to FIGS. 3A and 3B, the top surface 312 of clip 114 between the first end 122 of clip 114 and the step portion at 202 is a planar top surface 312. The surface pattern 118 has a length illustrated at 138 in a longitudinal direction 140 of the clip 114. In one embodiment, the bottom surface 120 of clip 114 between the step portion at 202 and the surface pattern 118 is parallel with at least a portion of the top surface 126 of the terminal pad 128 (See also, FIG. 1). In one embodiment, the bottom surface 120 of clip 114 between the step portion at 202 and the surface pattern 118 is parallel with the bottom surface 120 of clip 114 between the second end 132 and the step portion at 204. In one embodiment, the clip 114 between the first end 122 and the step portion edge at 202 has a height in a direction perpendicular with a plane of the bottom surface 142 of the die pad 106 that is greater than a height of the clip 114 between the second end 132 and the step portion at 204 (See also, FIGS. 1 and 2).

Referring to FIG. 3A, the features 302 of the surface pattern 118 have a hemispherical shape. The features 302 extend downward from the bottom surface 120 of the clip 114 by a distance between dash lines 304 and 306 as illustrated by arrows 308 and 310. In the illustrated embodiment, the distance between dash lines 304 and 306 is equal to or greater than 30 microns. In other embodiments, the distance between dash lines 304 and 306 can be less than 30 microns. The features 302 are spaced apart by a distance between dash lines 314 and 316 as illustrated by arrows 318 and 320 by a distance that is equal to or greater than 30 microns. In other embodiments, the distance between dash lines 314 and 316 can be less than 30 microns.

Referring to FIG. 3B, the features 322 of the surface pattern 118 are parallel rectangular bar features. The features 322 extend downward from the bottom surface 120 of the clip 114 by a distance between dash lines 324 and 326 as illustrated by arrows 328 and 330. In the illustrated embodiment, the distance between dash lines 324 and 326 is equal to or greater than 30 microns. In other embodiments, the distance between dash lines 324 and 326 can be less than 30 microns. The features 322 are spaced apart by a distance between dash lines 332 and 334 as illustrated by arrows 336 and 338 by a distance that is equal to or greater than 30 microns. In other embodiments, the distance between dash lines 332 and 334 can be less than 30 microns.

Figure 4A:
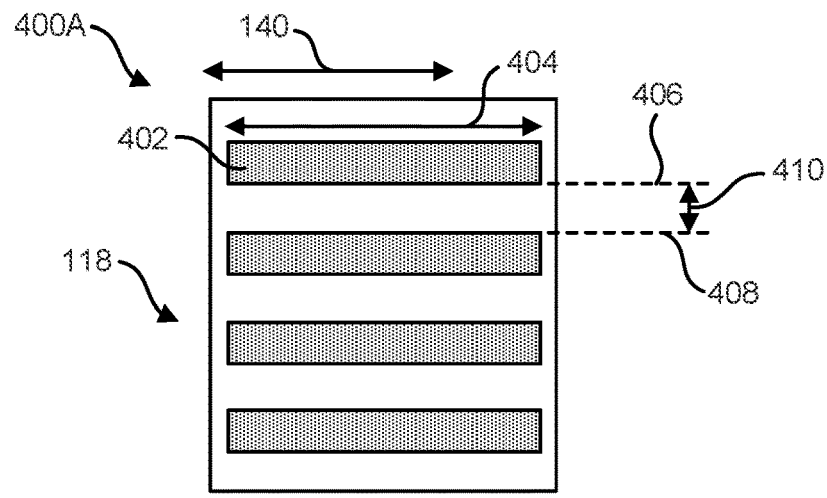
FIGS. 4A-4C illustrate embodiments of a bottom view of surface patterns for a clip.
Figure 4B:
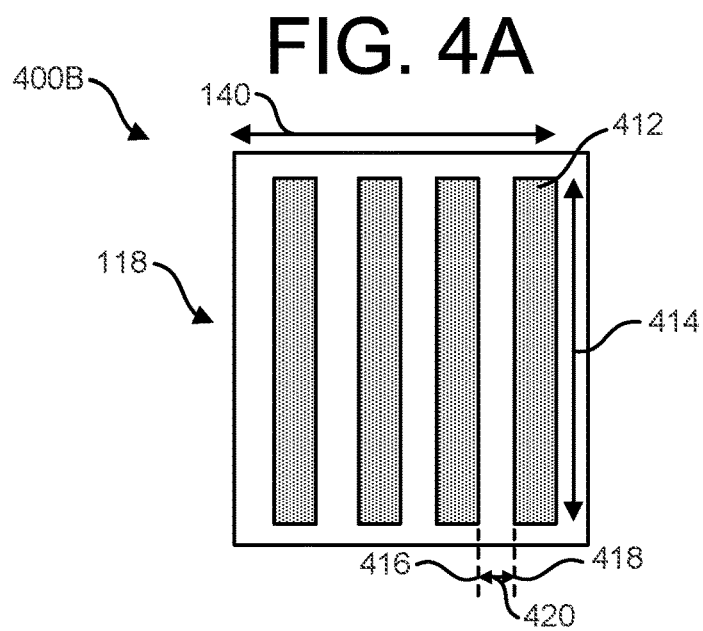
Figure 4C:
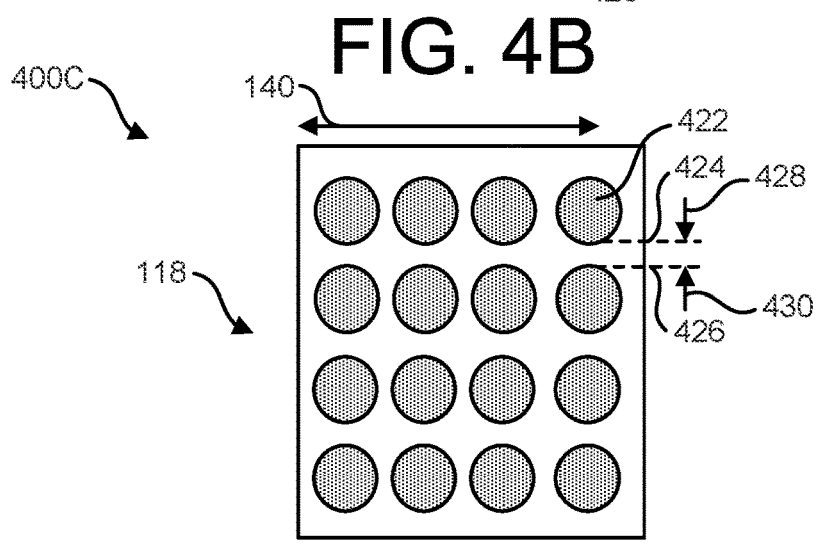

FIGS. 4A-4C illustrate embodiments at 400A, 400B and 400C of a bottom view of surface patterns 118 for a clip 114. FIG. 4A illustrates an embodiment at 400A of parallel rectangular bar features at 402. Each rectangular bar feature 402 has a long dimension 404 in the longitudinal direction 140 of the clip 114. In the illustrated embodiment, each rectangular bar feature 402 is spaced apart from an adjacent rectangular bar feature 402 by a distance 410 between dash lines 406 and 408 that is equal to or greater than 30 microns. In other embodiments, each rectangular bar feature 402 is spaced apart from an adjacent rectangular bar feature 402 by a distance 410 that is less than 30 microns.

FIG. 4B illustrates an embodiment at 400B of parallel rectangular bar features at 412. Each rectangular bar feature 412 has a long dimension 414 in a direction transverse to the longitudinal direction 140 of the clip 114. In the illustrated embodiment, each rectangular bar feature 412 is spaced apart from an adjacent rectangular bar feature 412 by a distance 420 between dash lines 416 and 418 that is equal to or greater than 30 microns. In other embodiments, each rectangular bar feature 412 is spaced apart from an adjacent rectangular bar feature 412 by a distance 420 that is less than 30 microns.

FIG. 4C illustrates an embodiment at 400C of a three by three or greater array of spaced-apart features 422 each having a hemispherical shape. In the illustrated embodiment, the array of spaced-apart features 422 is a four by four array of spaced-apart features 422. In other embodiments, the array of spaced-apart features 422 can be a two by two array of spaced-apart features 422 or a five by five or greater array of spaced-apart features 422. In other embodiments, the array of spaced-apart features 422 can be a two by three or greater array of spaced-apart features 422 or can be a three by two or greater array of spaced-apart features 422. In other embodiments, the spaced apart features can be any suitable combination or derivative of the features 402, 412 and 422. In the illustrated embodiment, each one of the spaced apart features 422 is spaced apart from an adjacent one of the spaced apart features 422 by a distance between arrows 428 and 430 between the dash lines 424 and 426 that is equal to or greater than 30 microns. In other embodiments, each one of the spaced apart features 422 is spaced apart from an adjacent one of the spaced apart features 422 by a distance between arrows 428 and 430 between the dash lines 424 and 426 that is less than 30 microns.

Figure 5:
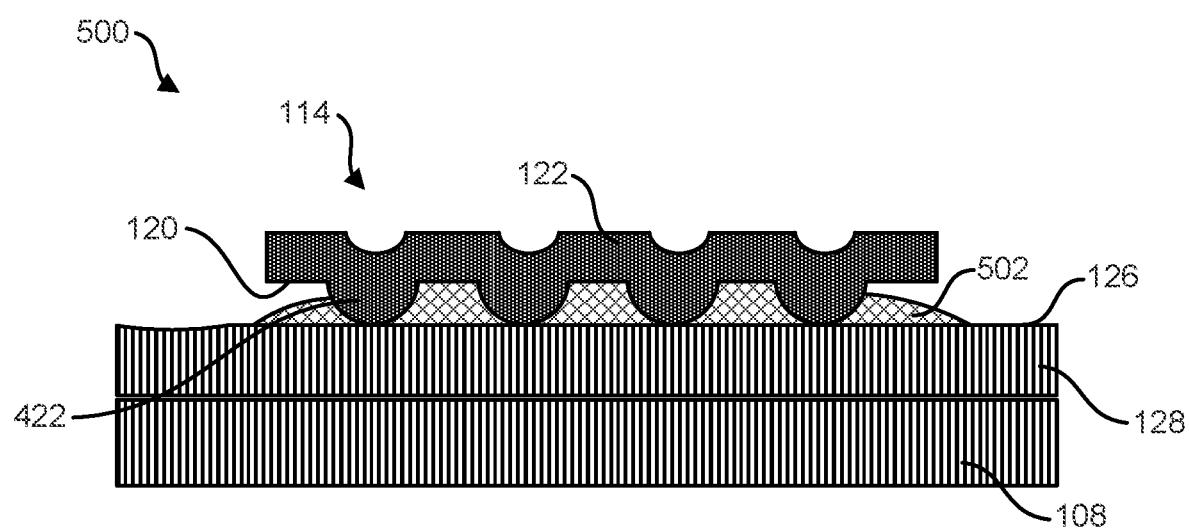
FIG. 5 illustrates an embodiment of a sectional view of a clip and lead.

FIG. 5 illustrates an embodiment at 500 of sectional view of the clip 114 and lead 108 illustrated in FIG. 1. The sectional view at 500 is in the longitudinal direction 140 in a direction from the first end 122 to the second end 132 of clip 114. The features 422 extend downward from the bottom surface 120 of clip 114 and contact the top surface 126 of terminal pad 128 of the lead 108. In the embodiment illustrated in FIG. 5, the features 422 are an array of spaced-apart features 422 each having a hemispherical shape (See also, FIGS. 3A and 4C). In other embodiments, the features 422 can be any suitable combination or derivative of the features 402, 412 and 422 illustrated in FIGS. 4A-4C. In the illustrated embodiment, the portion 124 of the surface pattern 118 is attached to the terminal pad 128 of lead 108 via solder as illustrated at 502 (See also, FIG. 1). Solder 502 at least partially fills portion 124 of the surface pattern 118 to attach portion 124 of the surface pattern 118 to the top surface 126 of the terminal pad 128 (See also, FIG. 1).

Figure 6:
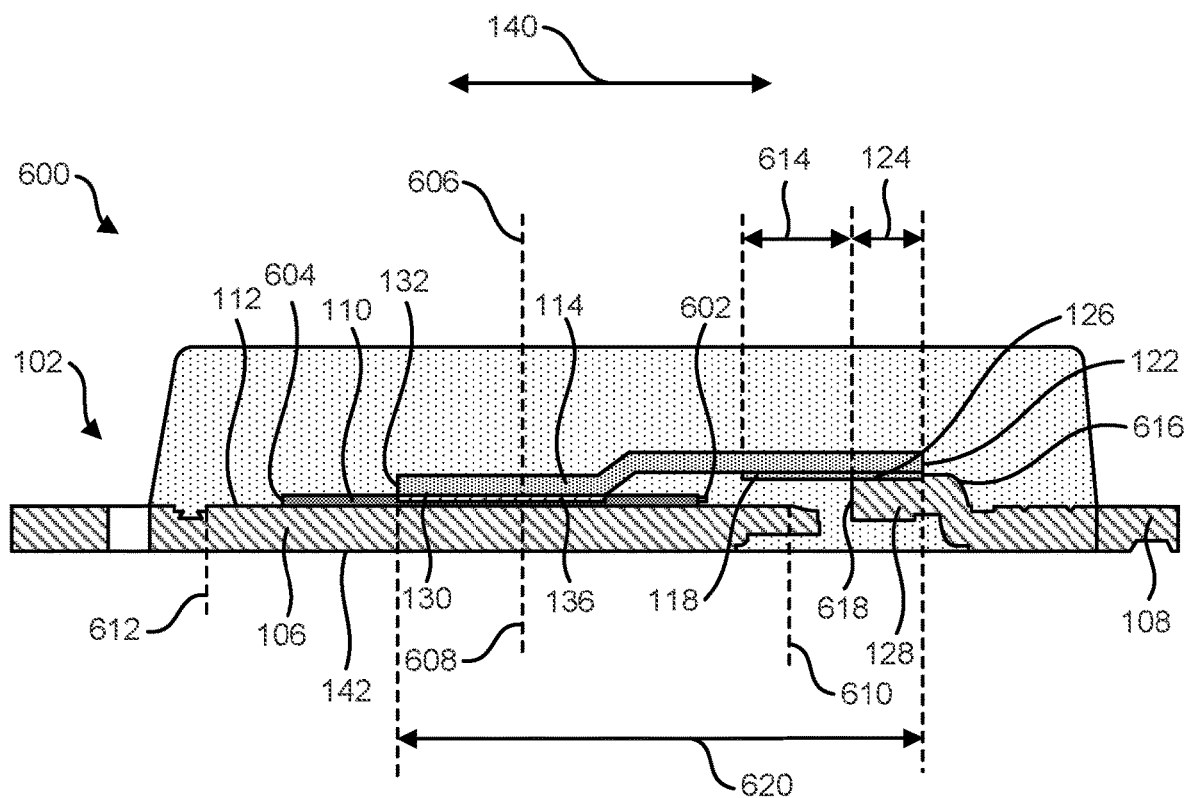
FIG. 6 illustrates an embodiment of an integrated circuit package.
Figure 7:
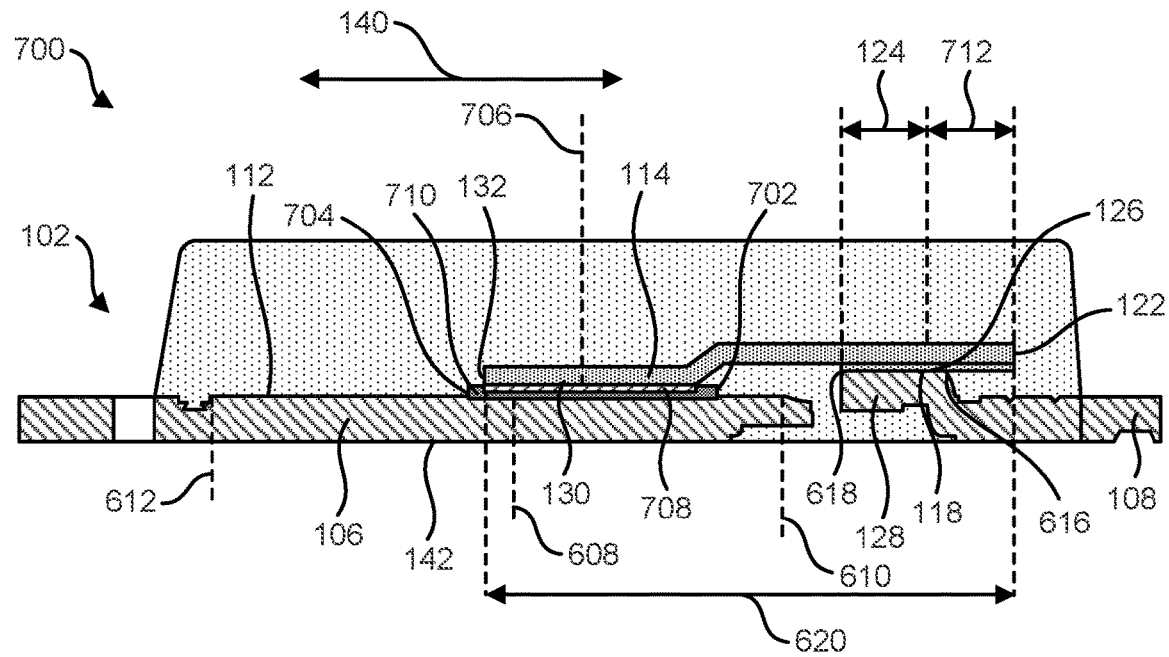
FIG. 7 illustrates an embodiment of an integrated circuit package.

FIG. 6 illustrates an embodiment of an integrated circuit package at 600. FIG. 7 illustrates an embodiment of an integrated circuit package at 700. In the embodiments illustrated in FIGS. 6 and 7, integrated circuit packages 600 and 700 utilize the same leadframe 102 and clip 114, but integrated circuit die 110 within integrated circuit package 600 is larger in size than integrated circuit die 710 within integrated circuit package 700. In the embodiments illustrated in FIGS. 6 and 7, the leadframe 102 and clip 114 together can make up an apparatus that can be used to manufacture integrated circuit packages with integrated circuit dies 110 having different sizes.

Referring to FIG. 6, leadframe 102 includes a die pad 106 and a lead 108. A semiconductor die 110 is attached to a top surface 112 of the die pad 106. A clip 114 includes a lead contact area 116 with a surface pattern 118 on a bottom surface 120 of the clip 114 that is proximate to a first end 122 of the clip 114 (See also, FIG. 2). The clip 114 includes a surface pattern 118 on a bottom surface 120 of clip 114 that includes features (e.g., 402, 412 and/or 422) that extend downward from the bottom surface 120 of the clip 114 (See also, FIGS. 3A-4C). In the illustrated embodiment, the clip 114 comprises copper (Cu) and the leadframe 102 comprises copper (Cu). In other embodiments, leadframe 102 can be formed from other suitable materials that include, but are not limited to, aluminum (Al), nickel (Ni), iron (Fe) and steel. In the illustrated embodiment, semiconductor die 110 is a Metal Oxide Semiconductor Field-effect Transistor (MOSFET) and includes a top contact 136 which is a source contact and includes a bottom drain contact which is electrically coupled to the top surface 112 of die pad 106. In other embodiments, semiconductor die 110 can be other suitable types of devices such as an Insulated Gate Bipolar Transistor (IGBT), a Gallium Nitride (GaN) device or a Silicon Carbide (SiC) device.

In the illustrated embodiment, semiconductor die 110 has a right side 602, a left side 604 and a center 606 equidistant from the right side 602 and the left side 604 in a direction parallel with the plane of the top surface 112 of the die pad 106. The top surface 112 of the die pad 106 has a center 608, a right side 610 and a left side 612. Semiconductor die 110 is attached to the top surface 112 of the die pad 106 such that a center 606 of the semiconductor die 110 is approximately at the center 608 of the top surface 112 of the die pad 106.

In the illustrated embodiment, the surface pattern 118 for clip 114 has a length illustrated as a sum of length 124 and length 614 in a longitudinal direction 140 of the clip 114 in a direction parallel with a plane of the bottom surface 142 of the die pad 106. Length 124 represents a length of the top surface 126 of the terminal pad 128 which is less than the sum of lengths 124 and 614 that represent the length of surface pattern 118. The die contact area 130 of the clip 114 is attached to the top contact 136 on the semiconductor die 110 above the top surface 112 of the die pad 106 at approximately the center 608 of the top surface 112 of the die pad 106. A portion illustrated at 124 of the surface pattern 118 is attached to the top surface 126 of terminal pad 128. In the longitudinal direction 140 of the clip 114, other portions of surface pattern 118 not attached to top surface 126 of terminal pad 128 are illustrated at 614 and are on a left side 618 of the top surface 126 of the terminal pad 128. In other embodiments, other portions of surface pattern 118 not attached to top surface 126 of terminal pad 128 can be on a right side 616 of the top surface 126 of the terminal pad 128, or on both the right side 616 and the left side 618 of the top surface 126 of the terminal pad 128.

In the illustrated embodiment, clip 114 has a length between first end 122 and second end 132 illustrated at 620 that is the same as for the embodiment illustrated in FIG. 7. The total on-resistance of semiconductor die 110 and integrated circuit package 600 when semiconductor die 110 is conducting current is a sum of the resistance of semiconductor die 110 which is mounted on die pad 106 and the resistance of the package which includes clip 114. Because semiconductor die 110 is mounted at approximately at the center 608 of die pad 106 such that the top contact 136 on semiconductor die 110 is approximately above the center 608 of the die pad 106, the full length 620 of clip 114 is utilized to connect top contact 136 of semiconductor die 110 to the top surface 126 of terminal pad 128.

Referring to FIG. 7, a lead frame 102 includes a die pad 106 and a lead 108. A semiconductor die 710 is attached to a top surface 112 of the die pad 106. A clip 114 includes a lead contact area 116 with a surface pattern 118 on a bottom surface 120 of the clip 114 that is proximate to a first end 122 of the clip 114 (See also, FIG. 2). The clip 114 includes a surface pattern 118 on a bottom surface 120 of clip 114 that includes features (e.g., 402, 412 and/or 422) that extend downward from the bottom surface 120 of the clip 114 (See also, FIGS. 3A-4C). In the illustrated embodiment, the clip 114 comprises copper (Cu) and the leadframe 102 comprises copper (Cu). In other embodiments, leadframe 102 can be formed from other suitable materials that include, but are not limited to, aluminum (Al), nickel (Ni), iron (Fe) and steel. In the illustrated embodiment, semiconductor die 710 is a Metal Oxide Semiconductor Field-effect Transistor (MOSFET) and includes a top contact 708 which is a source contact and includes a bottom drain contact which is electrically coupled to the top surface 112 of die pad 106. In other embodiments, semiconductor die 710 can be other suitable types of devices such as an Insulated Gate Bipolar Transistor (IGBT), a Gallium Nitride (GaN) device or a Silicon Carbide (SiC) device.

In the illustrated embodiment, semiconductor die 710 has a right side 702, a left side 704 and a center 706 equidistant from the right side 702 and the left side 704 in a direction parallel with the plane of the top surface 112 of the die pad 106. The top surface 112 of the die pad 106 has a center 608, a right side 610 and a left side 612. Semiconductor die 710 is attached to the top surface 112 of the die pad 106 such that a center 706 of the semiconductor die 710 is between the center 608 and the right side 610 of the top surface 112 of the die pad 106. In the illustrated embodiment, the surface pattern 118 for clip 114 has a length illustrated as a sum of length 124 and length 712 in a longitudinal direction 140 of the clip 114 in a direction parallel with a plane of the bottom surface 142 of the die pad 106. Length 124 represents a length of the top surface 126 of the terminal pad 128 which is less than the sum of lengths 124 and 712 that represent the length of surface pattern 118. The die contact area 130 of the clip 114 is attached to the top contact 708 on the semiconductor die 710 above the top surface 112 of the die pad 106 and between the center 608 and the right side 610 of the top surface 112 of the die pad 106. A portion illustrated at 124 of the surface pattern 118 is attached to the top surface 126 of terminal pad 128. In the longitudinal direction 140 of the clip 114, other portions of surface pattern 118 not attached to top surface 126 of terminal pad 128 are illustrated at 712 and are on a right side 616 of the top surface 126 of the terminal pad 128. In other embodiments, other portions of surface pattern 118 not attached to top surface 126 of terminal pad 128 can be on the left side 618 of the top surface 126 of the terminal pad 128, or on both the right side 616 and the left side 618 of the top surface 126 of the terminal pad 128.

In the illustrated embodiment, clip 114 has a length between first end 122 and second end 132 illustrated at 620 that is the same as for the embodiment illustrated in FIG. 6. The total on-resistance of semiconductor die 710 and integrated circuit package 700 when semiconductor die 710 is conducting current is a sum of the resistance of semiconductor die 710 which is mounted on die pad 106 and the resistance of the package which includes clip 114. Because semiconductor die 710 is mounted such that a center 706 of semiconductor die 710 is between the center 608 and the right side 610 of the die pad 106 such that the top contact 708 on semiconductor die 710 is above top surface 112 of die pad 106 between the center 608 and the right side 610 of the die pad 106, only a portion of the full length 620 of clip 114 is utilized to connect top contact 708 of semiconductor die 710 to the top surface 126 of terminal pad 128. As a result, the effective length of clip 114 is reduced by the portion 712 of the surface pattern 118 that is to the right side 616 of terminal pad 128 which provides a corresponding reduction in the resistance of clip 114.

Figure 8:
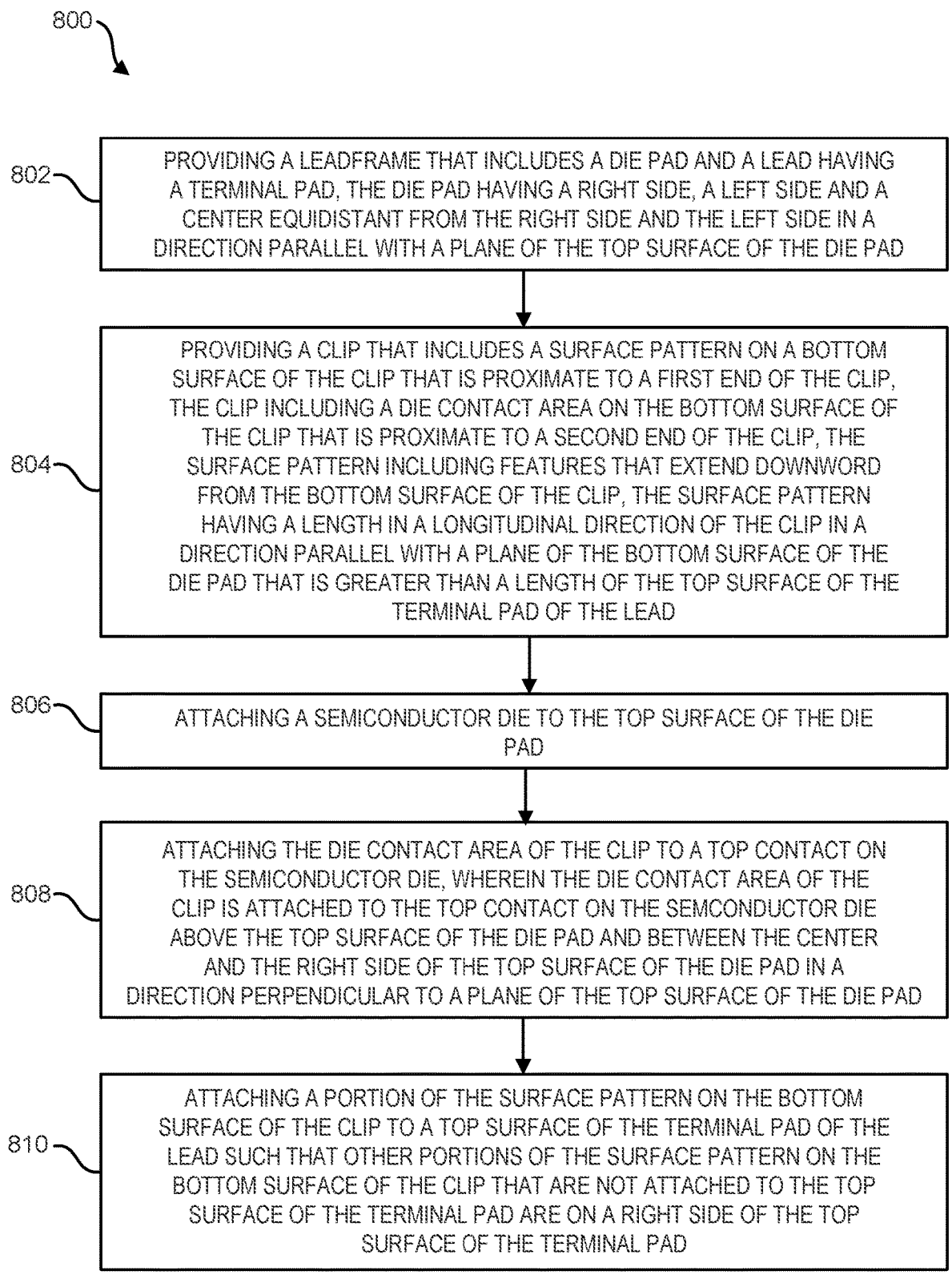
FIG. 8 illustrates an embodiment of a method of forming an integrated circuit package with a clip.

FIG. 8 illustrates an embodiment at 800 of a method of forming an integrated circuit package with a clip. Method 800 illustrates an embodiment of forming integrated circuit package 700 illustrated in FIG. 7. At 802, the method includes providing a leadframe 102 that includes a die pad 106 and a lead 108 having a terminal pad 128. The die pad 106 has a right side 610, a left side 612, and a center 608 equidistant from the right side 610 and the left side 612 in a direction parallel with a plane of the top surface 112 of die pad 106. At 804, the method includes providing a clip 114 that includes a surface pattern 118 on a bottom surface 120 of the clip 114 that is proximate to a first end 122 of the clip 114 (See also, FIGS. 2-3B). The clip 114 includes a die contact area 130 on the bottom surface 120 of the clip 114 that is proximate to a second end 132 of the clip 114 (See also, FIGS. 2-3B). The surface pattern 118 includes features (e.g., 402, 412 and/or 422) that extend downward from the bottom surface 120 of the clip 114 (See also, FIGS. 3A-4C). The surface pattern has a length 138 in a longitudinal direction 140 of the clip 114 in a direction parallel with a plane of the bottom surface 142 of the die pad 106 that is greater than a length 124 of the top surface 126 of the terminal pad 128 of the lead 108 (See also, FIG. 1). In the embodiment illustrated in FIG. 7, the surface pattern 118 for clip 114 has a length illustrated as a sum of length 124 and length 712 in a longitudinal direction 140 of the clip 114 in a direction parallel with a plane of the bottom surface 142 of the die pad 106.

At 806, the method includes attaching a semiconductor die 710 to the top surface 112 of the die pad 106. The semiconductor die 710 is attached to the top surface 112 of the die pad 106 such that a center 706 of the semiconductor die 710 is between the center 608 and the right side 610 of the top surface 112 of the die pad 106.

At 808, the method includes attaching the die contact area 130 of the clip 114 to a top contact 708 on the semiconductor die 710. The die contact area 130 of the clip 114 is attached to the top contact 708 on the semiconductor die 710 above the top surface 112 of the die pad 106 at a position that is between the center 608 and the right side 610 of the top surface 112 of the die pad 106 in a direction perpendicular to a plane of the top surface 112 of the die pad 106.

At 810, the method includes attaching a portion of the surface pattern 118 on the bottom surface 120 of the clip 114 to a top surface 126 of the terminal pad 128 of the lead 108. Other portions of surface pattern 118 on the bottom surface 120 of the clip 114 that are not attached to the top surface 126 of terminal pad 128 as illustrated at 712 are on a right side 616 of the top surface 126 of the terminal pad 128 (See also, FIG. 7). In the illustrated embodiment, attaching the portion of the surface pattern 118 on the bottom surface 120 of the clip 114 to the top surface 126 of the terminal pad 128 of the lead 108 includes using solder which at least partially fills the portion of the surface pattern 118 (See also, FIG. 5).

Figure 9:
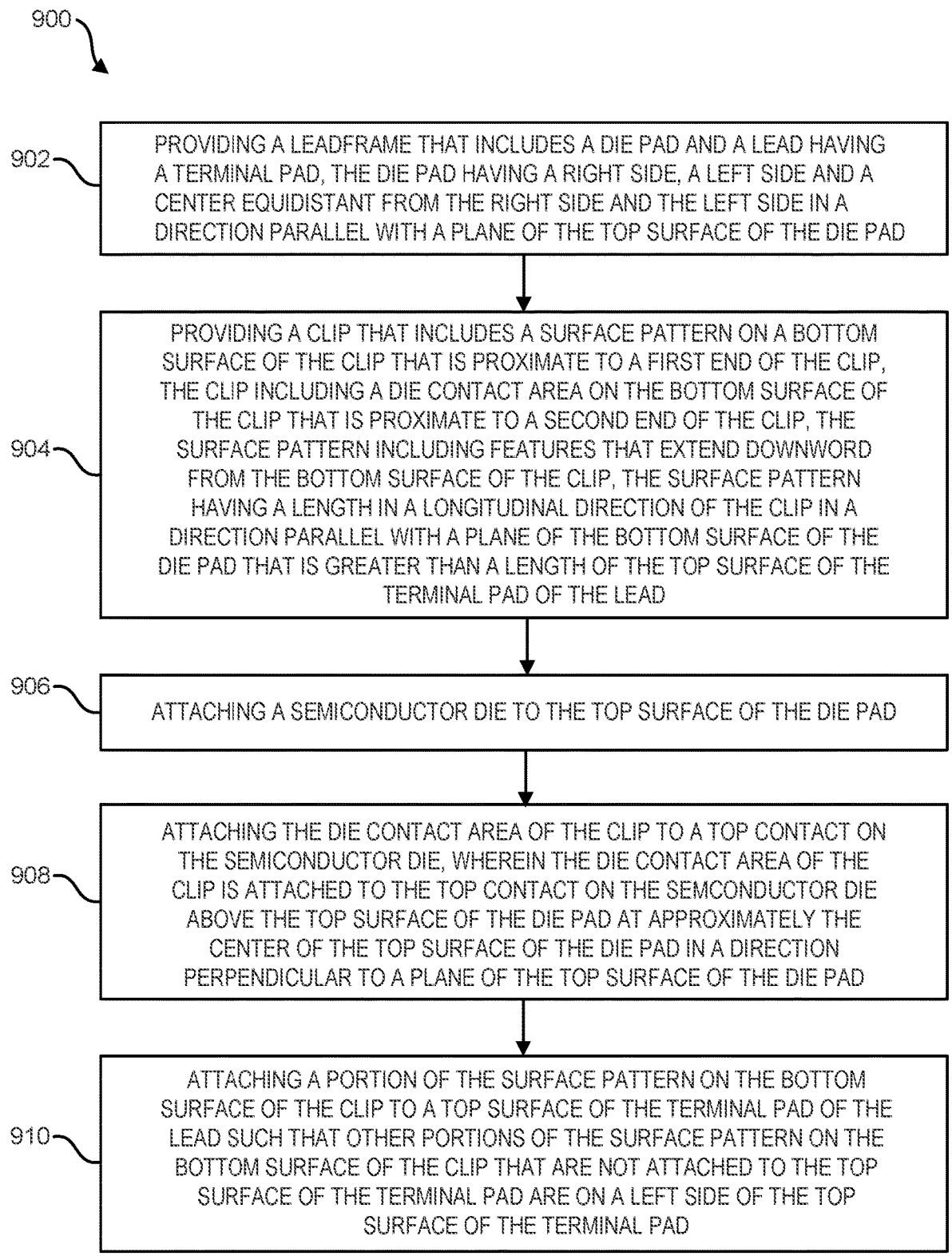
FIG. 9 illustrates an embodiment of a method of forming an integrated circuit package with a clip.

FIG. 9 illustrates an embodiment at 900 of a method of forming an integrated circuit package with a clip. Method 900 illustrates an embodiment of forming integrated circuit package 600 illustrated in FIG. 6. At 902, the method includes providing a leadframe 102 that includes a die pad 106 and a lead 108 having a terminal pad 128. The die pad 106 has a right side 610, a left side 612, and a center 608 equidistant from the right side 610 and the left side 612 in a direction parallel with a plane of the top surface 112 of die pad 106. At 904, the method includes providing a clip 114 that includes a surface pattern 118 on a bottom surface 120 of the clip 114 that is proximate to a first end 122 of the clip 114 (See also, FIGS. 2-3B). The clip 114 includes a die contact area 130 on the bottom surface 120 of the clip 114 that is proximate to a second end 132 of the clip 114 (See also, FIGS. 2-3B). The surface pattern 118 includes features (e.g., 402, 412 and/or 422) that extend downward from the bottom surface 120 of the clip 114 (See also, FIGS. 3A-4C). The surface pattern 118 has a length 138 in a longitudinal direction 140 of the clip 114 in a direction parallel with a plane of the bottom surface 142 of the die pad 106 that is greater than a length 124 of the top surface 126 of the terminal pad 128 of the lead 108 (See also, FIG. 1). In the embodiment illustrated in FIG. 6, the surface pattern 118 for clip 114 has a length illustrated as a sum of length 124 and length 614 in a longitudinal direction 140 of the clip 114 in a direction parallel with a plane of the bottom surface 142 of the die pad 106.

At 906, the method includes attaching a semiconductor die 110 to the top surface 112 of the die pad 106. In one embodiment, the semiconductor die 110 is attached to the top surface 112 of the die pad 106 such that a center 606 of the semiconductor die 110 is approximately aligned with the center 608 of the top surface 112 of the die pad 106.

At 908, the method includes attaching the die contact area 130 of the clip 114 to a top contact 136 on the semiconductor die 110. The die contact area 130 of the clip 114 is attached to the top contact 136 on the semiconductor die 110 above the top surface 112 of the die pad 106 at approximately the center 606 of the top surface 112 of the die pad 106 in a direction perpendicular to a plane of the top surface 112 of the die pad 106.

At 910, the method includes attaching a portion of the surface pattern 118 on the bottom surface 120 of the clip 114 to a top surface 126 of the terminal pad 128 of the lead 108. Other portions of surface pattern 118 on the bottom surface 120 of the clip 114 that are not attached to the top surface 126 of terminal pad 128 as illustrated at 614 are on a left side 618 of the top surface 126 of the terminal pad 128 (See also, FIG. 6). In the illustrated embodiment, attaching the portion of the surface pattern 118 on the bottom surface 120 of the clip 114 to the top surface 126 of the terminal pad 128 of the lead 108 includes using solder which at least partially fills the portion of the surface pattern 118 (See also, FIG. 5).

Figure 10:
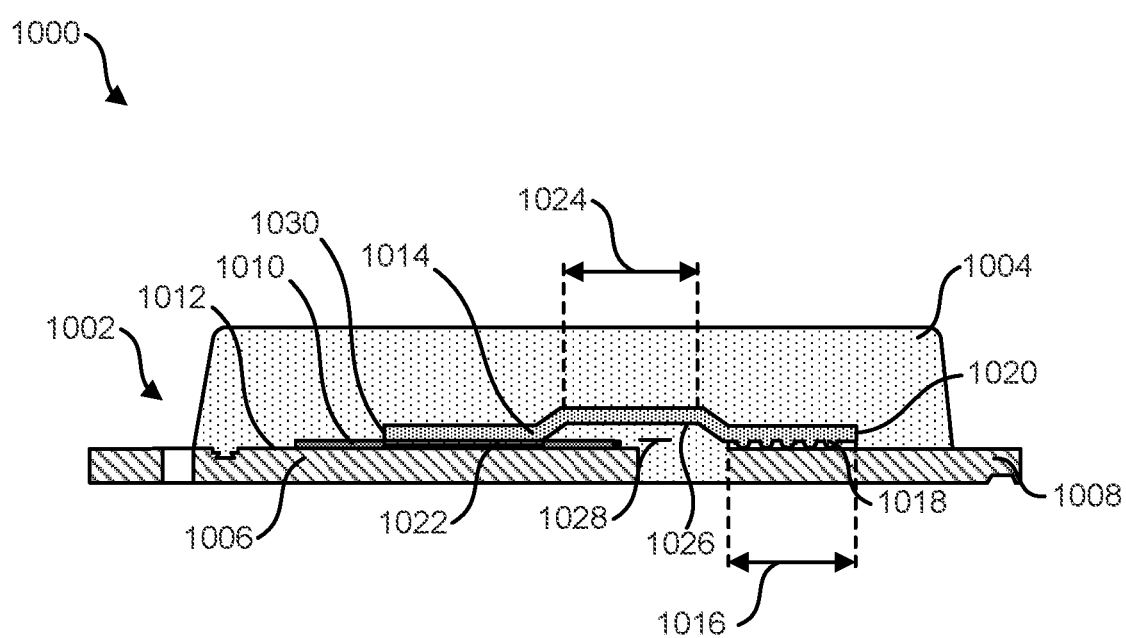
FIG. 10 illustrates an embodiment of a cross-sectional view of an integrated circuit package.

FIG. 10 illustrates an embodiment of a cross-sectional view of an integrated circuit package at 1000. A flat leadframe 1002 includes a die pad 1006 and a lead 1008. A semiconductor die 1010 is attached to a top surface 1012 of the die pad 1006. A clip 1014 includes a lead contact area illustrated at 1016 with a surface pattern 1018 on a bottom surface of the clip 1014 that is proximate to a first end 1020 of the clip 1014. The surface pattern 1018 includes features illustrated at 422 but can also include features such as those illustrated at 402 or 412, as well as other suitable features that extend downward from the bottom surface of the clip 1014 (See also, FIGS. 4A-4C). Clip 1014 has a center step portion illustrated at 1024 that is between the first end 1020 of clip 1014 and the second end 1030 of clip 1014. Clip 1014 has a height between a bottom surface 1026 of the step portion 1024 and a reference at 1028 which is sufficient to facilitate use of the clip 1014 with flat leadframe 1002. In one embodiment, the height between the bottom surface 1026 of the step portion 1024 and the reference at 1028 represents a height between the bottom surface 1026 of the step portion 1024 and a bottom surface of clip 1014 that contacts a top contact 1022 of semiconductor die 1010.

In the illustrated embodiment, the clip 1014 comprises copper (Cu) and the leadframe 1002 comprises copper (Cu). In other embodiments, the leadframe 1002 can be formed from other suitable materials that include, but are not limited to, aluminum (Al), nickel (Ni), iron (Fe) and steel. In the illustrated embodiment, semiconductor die 1010 is a Metal Oxide Semiconductor Field-effect Transistor (MOSFET) and includes the top contact 1022 which is a source contact and includes a bottom drain contact which is electrically coupled to the top surface 1012 of die pad 1006. In other embodiments, semiconductor die 1010 can be other suitable types of devices such as an Insulated Gate Bipolar Transistor (IGBT), a Gallium Nitride (GaN) device or a Silicon Carbide (SiC) device.

What is claimed is:

1. An integrated circuit package, comprising:
    a leadframe that includes a die pad and a lead, wherein a semiconductor die is attached to a top surface of the die pad; and
    a clip that includes a lead contact area on a bottom surface of the clip between a first end of the clip and a planar bottom surface of the clip, the planar bottom surface of the clip between the lead contact area and a die contact area on the bottom surface of the clip that is proximate to a second end of the clip, the lead contact area including a surface pattern, a portion of the surface pattern attached to a top surface of a terminal pad of the lead via solder, the die contact area attached to a top contact on the semiconductor die,
    wherein the surface pattern has a length in a longitudinal direction of the clip in a direction parallel with a plane of the bottom surface of the die pad that is less than a length of the lead contact area and greater than a length of the top surface of the terminal pad of the lead.

2. The integrated circuit package of claim 1, wherein the surface pattern includes features that extend downward from the bottom surface of the clip, and wherein the surface pattern comprises a pattern selected from a group of patterns consisting of parallel rectangular bar features each having a long dimension in the longitudinal direction of the clip, parallel rectangular bar features each having a long dimension in a direction transverse to the longitudinal direction of the clip, a three by three or greater array of spaced-apart features each having a hemispherical shape, and any combination or derivative of these features.

3. The integrated circuit package of claim 2, wherein the features that extend downward from the bottom surface of the clip contact the top surface of the terminal pad of the lead, and wherein the portion of the surface pattern is attached to the terminal pad of the lead via solder which at least partially fills the portion of the surface pattern.

4. The integrated circuit package of claim 1, wherein the clip includes a step portion between the first end of the clip and the second end of the clip, wherein the surface pattern is between the first end of the clip and the step portion, wherein the die contact area is between the second end of the clip and the step portion, and wherein the clip between the first end and the step portion has a height in a direction perpendicular with a plane of the bottom surface of the die pad that is greater than a height of the clip between the second end and the step portion.

5. The integrated circuit package of claim 4, wherein a top surface of the clip between the first end of the clip and the step portion is a planar top surface, and wherein the bottom surface of the clip between the step portion and the surface pattern is the planar bottom surface.

6. The integrated circuit package of claim 5, wherein the bottom surface of the clip between the step portion and the surface pattern is parallel with at least a portion of the top surface of the terminal pad.

7. The integrated circuit package of claim 6, wherein the bottom surface of the clip between the step portion and the surface pattern is parallel with the bottom surface of the clip between the second end and the step portion.

8. The integrated circuit package of claim 1, wherein the clip comprises copper (Cu).

9. The integrated circuit package of claim 1, wherein the leadframe comprises copper (Cu).

10. The integrated circuit package of claim 2, wherein the features of the surface pattern extend downward from the bottom surface of the clip by a distance that is equal to or greater than 30 microns.

11. The integrated circuit package of claim 2, wherein the parallel rectangular bar features and the spaced-apart features that each have the hemispherical shape are spaced apart by a distance that is equal to or greater than 30 microns.

12. The integrated circuit package of claim 1, wherein other portions of the surface pattern not attached to the top surface of the terminal pad, in the longitudinal direction of the clip are on a right side of the top surface of the terminal pad, on a left side of the top surface of the terminal pad, or on both the right side and the left side of the top surface of the terminal pad, wherein in the longitudinal direction of the clip, the left side of the top surface of the terminal pad is closer to the die pad of the leadframe than the right side of the top surface of the terminal pad.

13. The integrated circuit package of claim 1, wherein the semiconductor die comprises a device selected from a group consisting of a Metal Oxide Semiconductor Field-effect Transistor (MOSFET), an Insulated Gate Bipolar Transistor (IGBT), a Gallium Nitride (GaN) device and a Silicon Carbide (SiC) device.

14. An integrated circuit package, comprising:
a leadframe that includes a die pad and a lead, wherein a semiconductor die is attached to a top surface of the die pad, the semiconductor die having a right side, a left side and a center equidistant from the right side and the left side in a direction parallel with a plane of the top surface of the die pad;
a clip that includes a lead contact area on a bottom surface of the clip between a first end of the clip and a planar bottom surface of the clip, the planar bottom surface of the clip between the lead contact area and a die contact area on the bottom surface of the clip that is proximate to a second end of the clip, the lead contact area including a surface pattern, a portion of the surface pattern attached to a top surface of a terminal pad of the lead via solder, the die contact area attached to a top contact on the semiconductor die,
wherein the surface pattern includes features that extend downward from the bottom surface of the clip, the surface pattern having a length in a longitudinal direction of the clip in a direction parallel with a plane of the bottom surface of the die pad that is less than a length of the lead contact area and greater than a length of the top surface of the terminal pad of the lead.

15. The integrated circuit package of claim 14,
wherein the die contact area of the clip is attached to the top contact on the semiconductor die above the top surface of the die pad and between the center and the right side of the top surface of the die pad in a direction perpendicular to a plane of the top surface of the die pad, and
wherein other portions of the surface pattern on the bottom surface of the clip that are not attached to the top surface of the terminal pad are on a right side of the top surface of the terminal pad.

16. The integrated circuit package of claim 15,
wherein the semiconductor die has a right side, a left side and a center equidistant from the right side and the left side in the direction parallel with the plane of the top surface of the die pad, and
wherein the semiconductor die is attached to the top surface of the die pad such that a center of the semiconductor die is between the center and the right side of the top surface of the die pad.

17. The integrated circuit package of claim 14,
wherein the die contact area of the clip is attached to the top contact on the semiconductor die above the top surface of the die pad at approximately a center of the top surface of the die pad in a direction perpendicular with a plane of the top surface of the die pad, and
wherein other portions of the surface pattern on the bottom surface of the clip that are not attached to the top surface of the terminal pad are on a left side of the top surface of the terminal pad, wherein in the longitudinal direction of the clip, the left side of the top surface of the terminal pad is closer to the die pad of the leadframe than a right side of the top surface of the terminal pad.

18. The integrated circuit package of claim 14, wherein the surface pattern comprises a pattern selected from a group of patterns consisting of parallel rectangular bar features each having a long dimension in the longitudinal direction of the clip, parallel rectangular bar features each having a long dimension in a direction transverse to the longitudinal direction of the clip, a three by three or greater array of spaced-apart features each having a hemispherical shape, and any combination or derivative of these features.

19. The integrated circuit package of claim 14, wherein the clip comprises copper (Cu).

20. The integrated circuit package of claim 14, wherein the semiconductor die comprises a device selected from a group consisting of a Metal Oxide Semiconductor Field-effect Transistor (MOSFET), an Insulated Gate Bipolar Transistor (IGBT), a Gallium Nitride (GaN) device and a Silicon Carbide (SiC) device.

* * * * *